(12) United States Patent
Hirai et al.

(10) Patent No.: US 8,077,750 B2
(45) Date of Patent: Dec. 13, 2011

(54) OPTICAL TRANSMITTING MODULE AND OPTICAL TRANSMITTING DEVICE

(75) Inventors: Masahiro Hirai, Yokohama (JP); Hiroshi Yamamoto, Inagi (JP)

(73) Assignee: OpNext Japan, Inc., Kanagawa (JP)

( * ) Notice: Subject to any disclaimer, the term of this patent is extended or adjusted under 35 U.S.C. 154(b) by 549 days.

(21) Appl. No.: 12/358,746

(22) Filed: Jan. 23, 2009

(65) Prior Publication Data

US 2009/0196628 A1 Aug. 6, 2009

(30) Foreign Application Priority Data

Jan. 25, 2008 (JP) ................................. 2008-015583

(51) Int. Cl.
*H01S 3/10* (2006.01)
*H01S 3/00* (2006.01)
*H04B 10/04* (2006.01)

(52) U.S. Cl. ...... 372/38.1; 372/26; 372/38.02; 398/182; 398/183

(58) Field of Classification Search .................... 372/26, 372/38.1, 38.02

See application file for complete search history.

(56) References Cited

U.S. PATENT DOCUMENTS 6,044,097 A 3/2000 Kawamura et al.

FOREIGN PATENT DOCUMENTS

JP 3330451 7/2002

OTHER PUBLICATIONS

Shigeki Makino et al "Wide Temperature Range(0 to 85° C.), 40-km SMF Transmission of a 1.55-um, 10Gbitis InGaAlAs Electroabsorption Modulator Integrated DFB Laser" Optical Fiber Communication Conference 2005 PDP14, 200 Optical Society of America.
Mkino et al "Wide Temperature Range(0 to 85° C.), 40-km SMF Transmission of a 1.55-um, 10Gbit/s InGaAlAs Electroabsorption Modulator Integrated DFB Laser" Optical Fiber Communication Conference 2005 PDP14, 200 Optical Society of America.

*Primary Examiner* — Armando Rodriguez
(74) *Attorney, Agent, or Firm* — McDermott Will & Emery LLP

(57) ABSTRACT

An optical transmitting module of a coaxial type is provided in which a disturbance in a waveform of light which is output from a semiconductor laser element due to a signal which is output from an optical modulator unit can be suppressed. The optical transmitting module comprises an optical transmitting package of a coaxial type and a line board (40) connected to the optical transmitting package. The optical transmitting package comprises a semiconductor laser element, an optical modulator unit, and a conductor board (21). A drive current supply line (42) and a common ground line are formed over the line board (40), and a signal attenuation circuit (60) having one end electrically connected to the common ground line and the other end electrically connected to the drive current supply line (42) is provided over the line board (40).

8 Claims, 8 Drawing Sheets

OPTICAL TRANSMITTING MODULE AND OPTICAL TRANSMITTING DEVICE

CROSS-REFERENCE TO RELATED APPLICATIONS

The present application claims priority from Japanese application JP 2008-015583 filed on Jan. 25, 2008, the content of which is hereby incorporated by reference into this application.

BACKGROUND OF THE INVENTION

1. Field of the Invention

The present invention relates to an optical transmitting module and an optical transmitting device.

2. Description of Related Art

In an optical source of an optical transmitting module for middle and long distances having a communication rate of 2.5 Gbit/s or greater, an optical transmitting module known as an EA integrated LD in which an electro-absorptive modulator (EA) and a semiconductor laser element (LD) are equipped is widely in use. In such an optical transmitting module, a high-frequency signal is supplied to the electro-absorptive modulator so that constant and stable light which is output from the semiconductor laser element is quickly modulated and a light signal is output.

In such an optical transmitting module, there is a rising desire to employ a coaxial package which can be easily manufactured with low cost. However, because such an optical transmitting module is easily affected by a change in temperature, a constant temperature control has been necessary in order to prevent degradation of the optical output intensity and the high-speed response characteristic due to the temperature change. For this purpose, a temperature control element having high power consumption must be provided in the optical transmitting module. In order to secure the equipping space of the temperature control element, in such an optical transmitting module, in the related art, a butterfly type optical transmitting package as disclosed in JP 3330451 in FIGS. 6(1) and 22 is mainly used.

In recent years, as disclosed in "Optical Fiber Communication Conference 2005, PDP14, 200", an EA integrated LD which does not require the constant temperature control has been introduced. With this structure, the equipping of the temperature control element in the optical transmitting package became no longer necessary. In addition, because there is a growing demand for reducing the size of the optical transmission and reception devices, receptacle type optical transmission and reception devices having an optical connecter as an interface are becoming more popular in place of pigtail type optical transmission and reception devices having an optical fiber as an interface. In receptacle type optical transmission and reception devices, because a mechanical stress is directly applied to the optical transmitting module during insertion and disconnection of the optical fiber, there is a concern that the reliability of a solder connection between a lead terminal of the optical transmitting module and a pad portion of a circuit board inside the optical transmission and reception devices may be significantly reduced. In order to avoid this, a flexible board is more widely used having a characteristic that an electrical line is formed with a conductor film formed over a base film on a connection portion of these elements, that the board can be repeatedly deformed because of its flexibility, and that the electrical characteristic is maintained even when the flexible board is deformed. In a multisource agreement for small size module of 10 Gbit/s (XMD-MSA) targeted to achieve common electrical, optical, and external shape specifications of the optical transmitting module and the optical receiving module, the use of the flexible board is set as a common specification.

As shown in FIG. 11 which is an equivalent circuit diagram of an optical transmitting module 10 having an optical modulator unit 24 such as an electro-absorptive modulator, in the optical transmitting module 10 having the optical modulator unit 24, a signal leaking from the optical modulator unit 24, that is, a signal which is output from the optical modulator 24, may reach a semiconductor laser element 23, and the waveform of the light which is output from the semiconductor laser element 23 may be disturbed.

FIG. 12 is a diagram showing an example frequency response characteristic of the optical transmitting module 10 shown in the equivalent circuit diagram of FIG. 11. FIG. 13 is a diagram showing an example optical output waveform of the optical transmitting module 10 shown in the equivalent circuit diagram of FIG. 11. As shown in FIG. 12, in the optical transmitting module 10 of the equivalent circuit diagram of FIG. 11, several dips 90 appear in a band of few GHz. Because of these dips 90, as shown in FIG. 13, an eye-aperture of the optical output waveform is degraded.

JP 3330451 discloses a technique in which a layered capacitor is equipped in an optical transmitting package in an optical transmitting module having a butterfly type optical transmitting package so that the influence of the signal which is output from the optical modulator unit on the semiconductor laser element is reduced. With the use of such a technique, the waveform of the light which is output from the semiconductor laser element can be stabilized.

SUMMARY OF THE INVENTION

In an optical transmitting module having an optical transmitting package of a coaxial type having a small volume inside the optical transmitting package, it is difficult to equip the layered capacitor inside the optical transmitting package.

The present invention was conceived in view of the above-described problem, and an advantage of the present invention is that an optical transmitting module of a coaxial type is provided in which a disturbance in a waveform of light which is output from a semiconductor laser element due to a signal which is output from an optical modulator unit can be suppressed.

In order to at least solve the above-described problem, according to one aspect of the present invention, there is provided an optical transmitting module having an optical transmitting package of a coaxial type and a line board which is connected to the optical transmitting package, wherein the optical transmitting package comprises a semiconductor laser element, an optical modulator unit which modulates, based on an input signal, light which is output from the semiconductor laser element, and a conductor board which is electrically connected to the semiconductor laser element and the optical modulator unit, a drive current supply line which supplies a drive current to the semiconductor laser element and a common ground line which electrically connects the conductor board and a common ground are formed over the line board, and a signal attenuation circuit which attenuates a signal which is output from the optical modulator unit and which has one end electrically connected to the common ground line and the other end electrically connected to the drive current supply line is provided over the line board.

According to the present invention, the signal attenuation circuit provided over the line board external to the optical transmitting package attenuates a signal of high frequency which is output from the optical modulator unit. Because of this, the influence by the signal reaching the semiconductor laser element is reduced, and, even in an optical transmitting module having an optical transmitting package of coaxial type, the disturbance of the waveform of the light which is output from the semiconductor laser element due to a signal which is output from the optical modulator unit can be suppressed.

According to another aspect of the present invention, it is preferable that, in the optical transmitting module, a signal line which supplies a signal to be input to the optical modulator unit is formed over the line board. According to this aspect of the present invention, it is possible to supply a signal to the optical modulator unit through the signal line.

According to another aspect of the present invention, it is preferable that, in the optical transmitting module, at least a part of the drive current supply line and at least a part of the signal line are formed approximately parallel to each other.

According to another aspect of the present invention, it is preferable that, in the optical transmitting module, the signal attenuation circuit is provided over the line board at a side of a surface opposite to a surface on which the line board is connected to the optical transmitting package. According to this aspect of the present invention, because the optical transmitting package and the line board are connected on a surface opposite of the surface over which the signal attenuation circuit is provided, it is possible to more easily connect the line board and optical transmitting package.

According to another aspect of the present invention, it is preferable that, in the optical transmitting module, an insulating film is formed between the drive current supply line and the common ground line, the line board further comprises a connection electrode for signal attenuation circuit which penetrates through the insulating film and which is electrically connected to the common ground line, and the signal attenuation circuit has one end electrically connected to the connection electrode for signal attenuation circuit and the other end electrically connected to the drive current supply line. According to this aspect of the present invention, even in a line board in which an insulating film is formed between the drive current supply line and the common ground line, it is possible to provide the signal attenuation circuit over the line board.

According to another aspect of the present invention, it is preferable that, in the optical transmitting module, the one end of the signal attenuation circuit is electrically connected to the common ground line at a position on the common ground line where an electrical distance to an end which is electrically connected to the conductor board is shorter than an electrical distance to an end which is electrically connected to the common ground. According to this aspect of the present invention, compared to the configuration in which the one end of the signal attenuation circuit is electrically connected to the common ground line at a position on the common ground line where an electrical distance to the end which is electrically connected to the conductor board is longer than an electrical distance to the end which is electrically connected to the common ground, the distance in which the signal attenuated by the signal attenuation circuit flows in the common ground line can be shortened.

According to another aspect of the present invention, it is preferable that, in the optical transmitting module, the signal attenuation circuit comprises a layered capacitor. According to this aspect of the present invention, it is possible to more greatly attenuate a signal which is output from the optical modulator unit compared to a optical transmitting module having a signal attenuation circuit having a single-layer capacitor.

According to anther aspect of the present invention, there is provided an optical transmitting device comprising the above-described optical transmitting module, a drive power supply which supplies the drive current to the semiconductor laser element, and a modulation signal generator circuit which generates a signal to be input to the optical modulator unit.

DESCRIPTION OF THE PREFERRED EMBODIMENTS

A preferred embodiment of the present invention will now be described with reference to the drawings.

Figure 1:
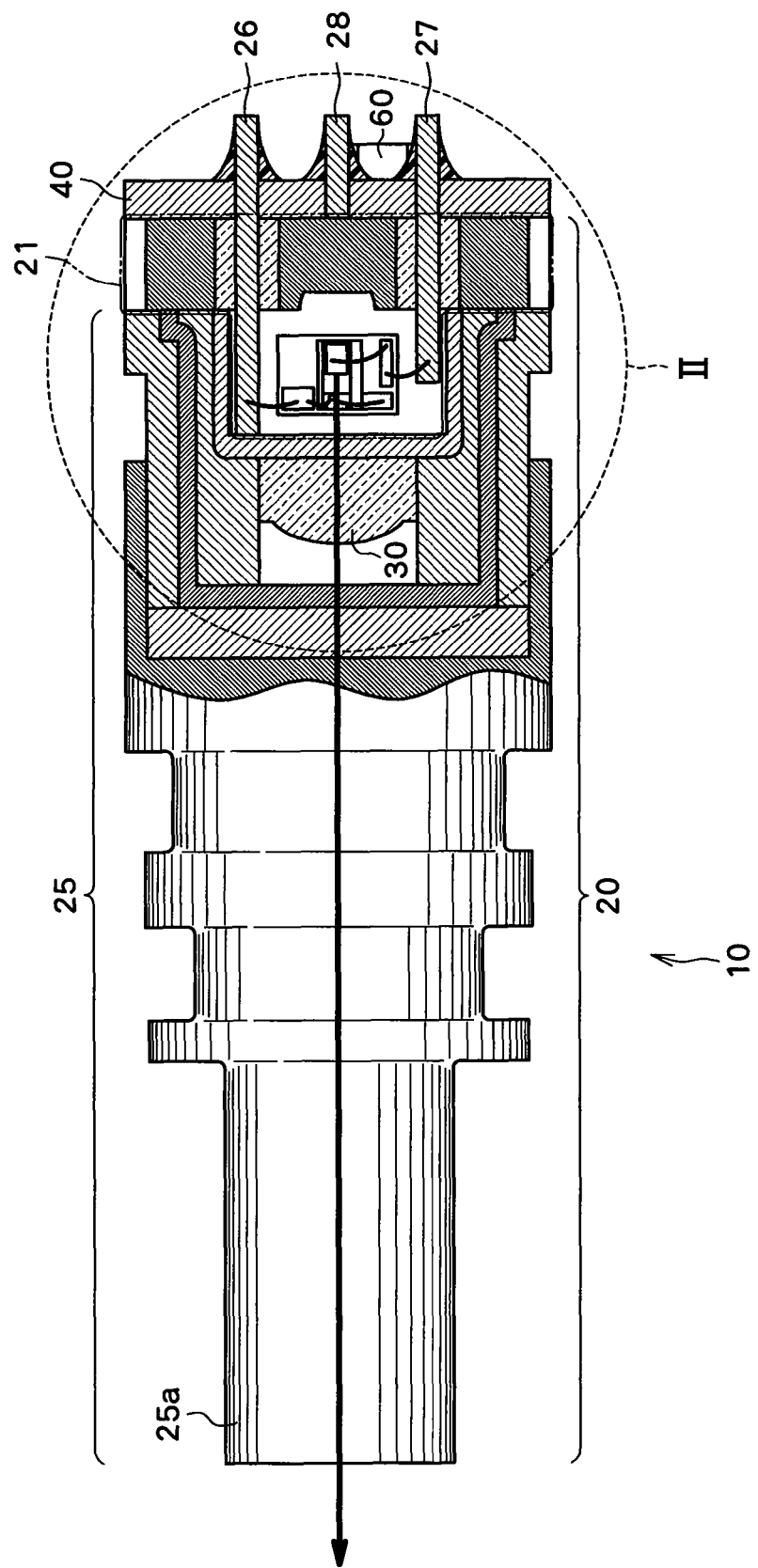
FIG. 1 is a diagram showing an example of a partial cross sectional view of an optical transmitting module of a preferred embodiment of the present invention.
Figure 2:
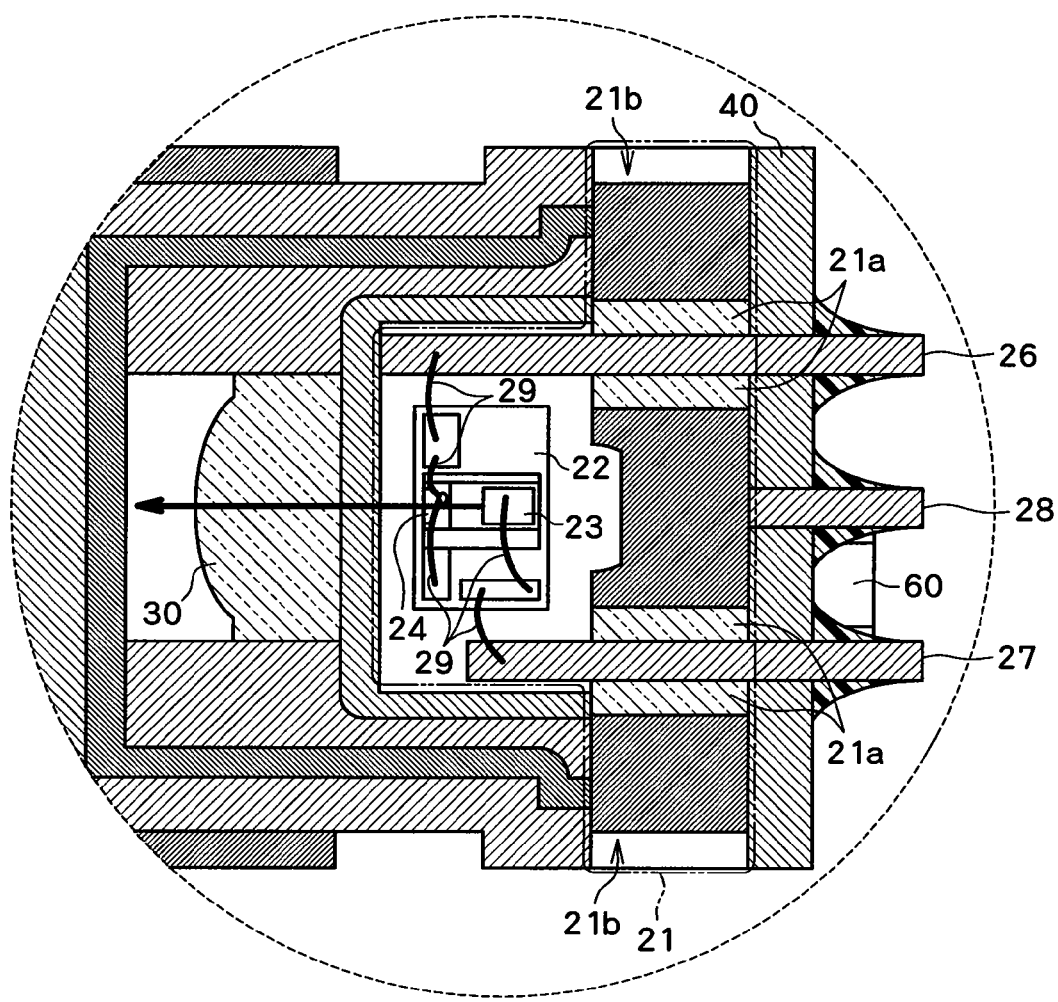
FIG. 2 is a diagram showing an example of a partial enlarged cross sectional view in which a region within a broken line of FIG. 1 is enlarged.
Figure 3:
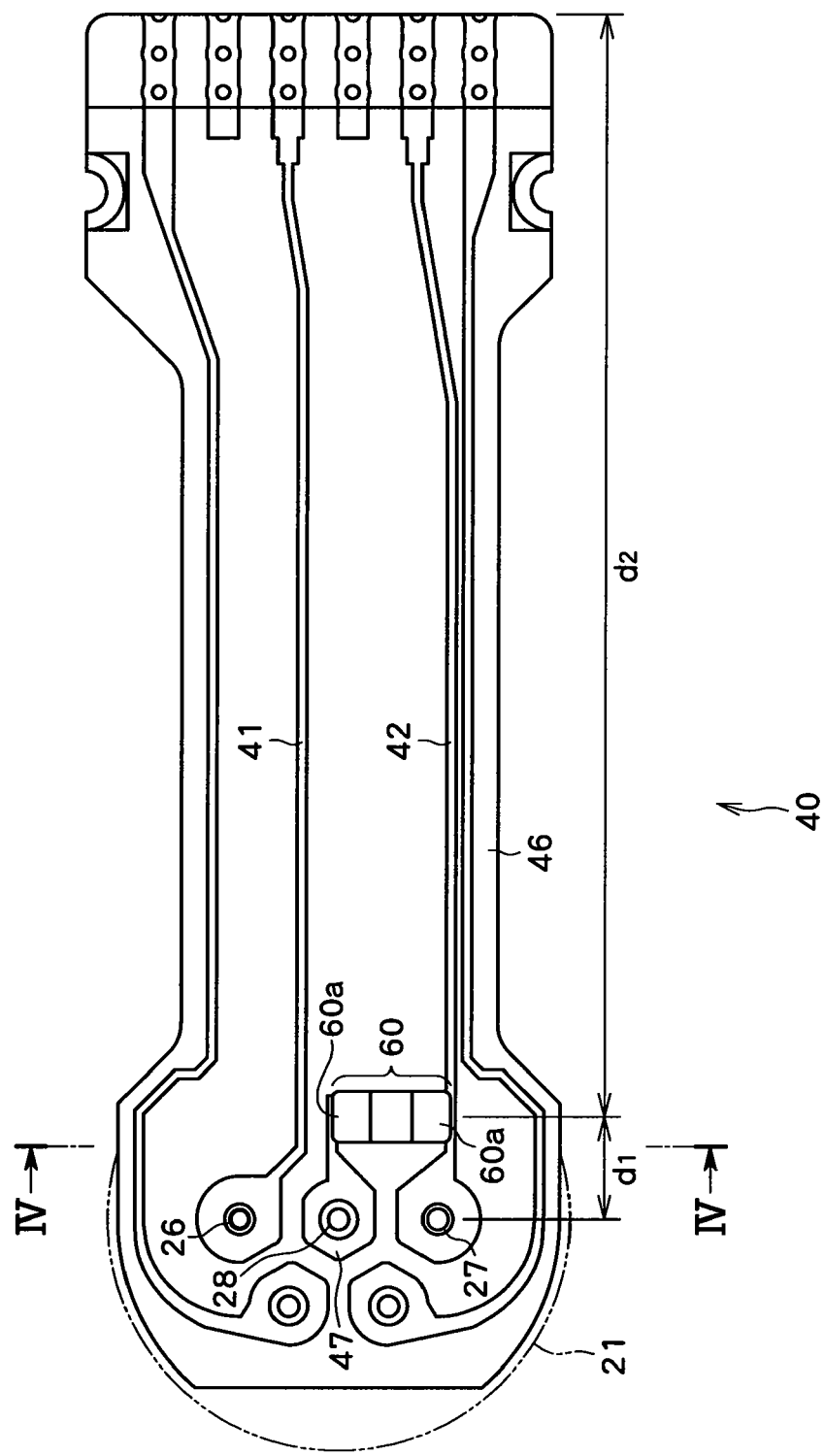
FIG. 3 is a diagram showing an example of a plan view of a line board connected to an optical transmitting module of a preferred embodiment of the present invention.
Figure 4:
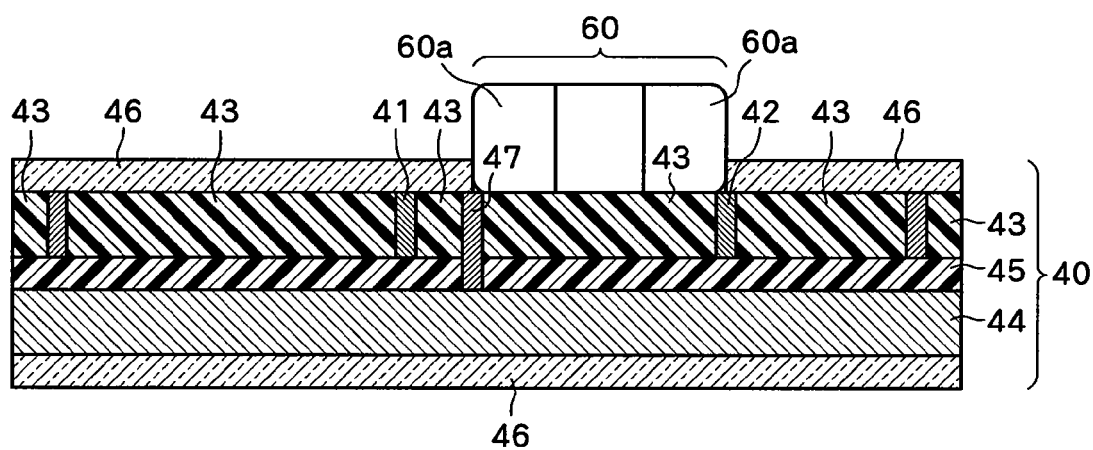
FIG. 4 is a diagram showing an example of an arrow IV-IV line enlarged cross sectional view in FIG. 3.
Figure 5:
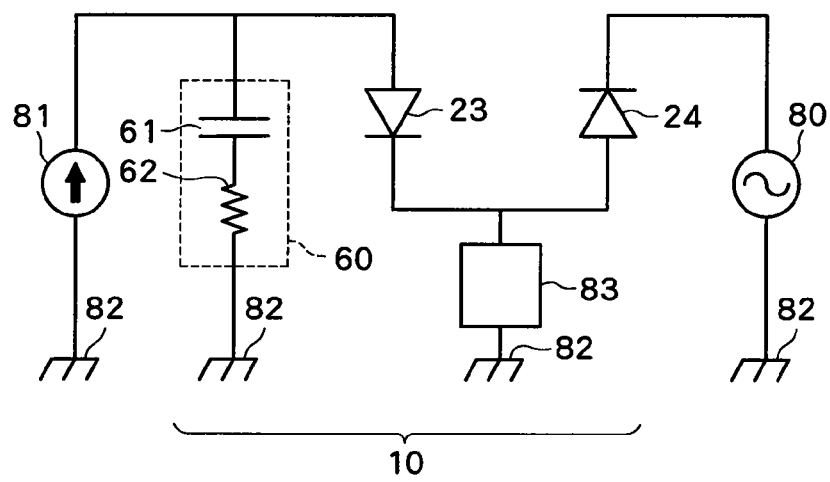
FIG. 5 is a diagram showing an example of an equivalent circuit diagram of an optical transmitting module of a preferred embodiment of the present invention.

FIG. 1 is a diagram showing an example of a partial cross sectional view of an optical transmitting module 10 of a preferred embodiment of the present invention. FIG. 2 is a diagram showing an example of a partial enlarged cross sectional view enlarging a region within a broken line in FIG. 1. FIG. 3 is a diagram showing an example of a plan view of a line board 40 connected to the optical transmitting module 10. FIG. 4 is a diagram showing an example of an arrow IV-IV enlarged cross sectional view in FIG. 3. FIG. 5 is a diagram showing an example of an equivalent circuit diagram of an optical transmitting module 10 of a preferred embodiment of the present invention.

The optical transmitting module 10 comprises an optical transmitting package 20 of a coaxial type, a line board 40 (for example, a flexible board) which is connected to the optical transmitting package 20, and a signal attenuation circuit 60.

The optical transmitting package 20 in the present embodiment comprises at least a conductor board 21 (for example, a metal stem), an equipping board 22, a semiconductor laser element 23, an optical modulator unit 24 (for example, electro-absorptive optical modulator), a reception unit 25, a signal terminal 26, a drive current supply terminal 27, a common ground terminal 28, a wire 29, and a lens 30.

The equipping board 22 is equipped on the conductor bard 21. Over the equipping board 22, the semiconductor laser element 23 and the optical modulator unit 24 are equipped. In this case, each of the semiconductor laser element 23 and the optical modulator unit 24 has one line connected with solder over the equipping board 22 and the other line connected to the conductor board 21 through a pattern on the equipping board 22. In this manner, the conductor board 21 is electrically connected to the semiconductor laser element 23 and the optical modulator unit 24.

In a position relationship such that the light which is output from the semiconductor laser element 23 is input to the optical modulator unit 24, the semiconductor laser element 23 and the optical modulator unit 24 are placed over the equipping board 22. The optical modulator unit 24 modulates and outputs light which is output from the semiconductor laser element 23.

The signal terminal 26 for supplying signals to the optical modulator unit 24 and the drive current supply terminal 27 for supplying a drive current to the semiconductor laser element 23 are provided penetrating through the conductor board 21. In this structure, in order to prevent electrical conduction of the signal terminal 26 and the drive current supply terminal 27 with the conductor board 21, glass beads 21a which is an insulating structure is formed on the conductor board 21 between the signal terminal 26 and the conductor board 21 and between the drive current supply terminal 27 and the conductor board 21.

The conductor board 21 and the reception unit 25 comprising a conductor such as a metal are connected through welding or the like so that the semiconductor laser element 23 and the optical modulator unit 24 are received in the reception unit 25. In addition, on the conductor board 21, a recess 21b which becomes a guide for determining the direction of connection with the reception unit 25 may be formed along the outer periphery of the conductor board 21, at every predetermined angle (for example, every 90 degrees).

The light which is output from the optical modulator unit 24 is output via the lens 30 and through a tip portion 25a of the reception unit 25 to an optical fiber or the like (not shown) connected to the optical transmitting package 20.

The common ground terminal 28 comprising a conductor such as a metal is blazed to the conductor board 21 and is electrically connected to the conductor board 21. The functions of the common ground terminal 28 will be described later.

The optical modulator unit 24 is connected to the signal terminal 26 with the wire 29. That is, the optical modulator unit 24 and the signal terminal 26 are wire-bonded to each other. In addition, the semiconductor laser element 23 is connected to the drive current supply terminal 27 with the wire 29. That is, the semiconductor laser element 23 and the drive current supply terminal 27 are wire-bonded to each other. Moreover, the optical modulator unit 24 and the semiconductor laser element 23 are electrically connected through a solder connection to a terminal for connecting to the circuit board, provided on the line board 40.

Over the line board 40, a signal line 41, a drive current supply line 42, an insulating member 43, a common ground line 44, an intermediate insulating film 45, and a surface insulating film 46 are formed. In addition, the line board 40 comprises a connection electrode 47 for signal attenuation circuit, and the line board 40 is in contact with the connection electrode 47 for signal attenuation circuit. A signal attenuation circuit 60 is provided over the line board 40.

The signal line 41, the drive current supply line 42, and the common ground line 44 comprise, for example, conductors such as a metal. At least a part of each of the signal line 41 and the drive current supply line 42 extends in a straight line shape. The insulting member 43 and the intermediate insulating film 45 comprise, for example, an insulator such as a resin. The surface insulating film 46 comprises a transparent insulator such as, for example, a transparent resin.

The intermediate insulating film 45 is formed over the surface of the common ground line 44. Over the surface of the intermediate insulating film 45, the signal line 41, the drive current supply line 42, and the insulating member 43 are formed. As described, the intermediate insulating film 45 may be formed between the drive current supply line 42 and the common ground line 44. In this structure, the surface of the signal line 41, the surface of the drive current supply line 42, and the surface of the insulating member 43 are on an approximately same surface. As described, in the present embodiment, the surface over which the drive current supply line 42 and the signal line 41 are formed and the surface over which the common ground line 44 is formed differ from each other. In this manner, the line board 40 may be formed so that the transmission path for transmitting the signal is a microstrip line. As described, the signal line 41 and the drive current supply line 42 may be placed approximately parallel to each other. In other words, the line board 40 may be formed such that at least a part of the signal line 41 and at least a part of the drive current supply line 42 are approximately parallel to each other.

The surface insulating film 46 is formed over a plane formed with the surface of the signal line 41, the surface of the drive current supply line 42, and the surface of the insulating member 43.

The surface insulating film 46 is also formed over a surface of the common ground line 44 which is at the opposite side from the surface over which the intermediate insulating film 45 is provided.

The signal line 41 has one end electrically connected to the signal terminal 26 through solder and the other end electrically connected to a modulation signal generator circuit 80 (for example, an alternate current source). The signal line 41 receives a signal to be input to the optical modulator unit 24 from the modulation signal generator circuit 80, and supplies the signal via the signal terminal 26 to the optical modulator unit 24.

The drive current supply line 42 has one end electrically connected to the drive current supply terminal 27 through solder and the other end electrically connected to a drive power supply 81 (for example, a constant current source). The drive current supply line 42 receives a drive current from the drive power supply 81 and supplies the current via the drive current supply terminal 27 to the semiconductor laser element 23.

The common ground line 44 has one end electrically connected to the common ground terminal 28 through solder, and the other end electrically connected to the common ground 82. That is, the common ground line 44 electrically connects the conductor board 21 and the common ground 82. The drive current which is output from the semiconductor laser element 23 and the signal which is output from the optical modulator unit 24 are output via the common ground terminal 28 and the common ground line 44 to the common ground 82. In this manner, the semiconductor laser element 23 and the optical modulator unit 24 are grounded.

The connection electrode 47 for signal attenuation circuit comprises, for example, a conductor such as a metal. The connection electrode 47 for signal attenuation circuit penetrates through the insulating member 43 and the intermediate insulating film 45 and reaches the common ground line 44. That is, the connection electrode 47 for signal attenuation circuit is electrically connected to the common ground line 44. The surface of the connection electrode 47 for signal attenuation circuit is on an approximately same plane as the plane formed with the surface of the signal line 41, the surface of the drive current supply line 42, and the surface of the insulating member 43.

The signal attenuation circuit 60 has one end electrically connected to the connection electrode 47 for signal attenuation circuit and the other end electrically connected to the drive current supply line 42. More specifically, for example, when both ends of the signal attenuation circuit 60 are plated with a metal plating 60a as in the present embodiment, one metal plating 60a is in contact with the connection electrode 47 for signal attenuation circuit and the other metal plating 60a is in contact with the drive current supply line 42.

In this manner, the signal attenuation circuit 60 has one end electrically connected to the common ground line 44 and the other end electrically connected to the drive current supply line 42. The signal attenuation circuit 60 is a circuit including a capacitive component 61 and a resistive component 62, and attenuates the signal which is output from the optical modulator unit 24. The signal attenuation circuit 60 may alternatively comprise a layered capacitor.

In this configuration, as shown in FIG. 3, the signal attenuation circuit 60 may be provided over the line board 40 which is at a side on the opposite surface of the surface which is connected to the optical transmitting package 20.

In addition, the one end of the signal attenuation circuit 60 may be electrically connected to the common ground line 44 at a position on the common ground line 44 where an electrical distance ($d_1$ in FIG. 3) to the end which is electrically connected to the conductor board 21 (for example, connected to the common ground terminal 28) is shorter than an electrical distance ($d_2$ in FIG. 3) to the end which is electrically connected to the common ground 82. More specifically, a configuration may be employed in which the electrical distance ($d_1$ in FIG. 3) to the end which is electrically connected to the conductor board 21 on the common ground line 44 is, for example, less than or equal to 3 mm.

The equivalent circuit diagram of FIG. 5 shows an impedance element 83 of the optical transmitting module of the present embodiment.

With the drive current which is supplied from the drive power supply 81 via the drive current supply line 42 and the drive current supply terminal 27 to the semiconductor laser element 23, the semiconductor laser element 23 outputs light to the optical modulator unit 24.

Light which is output from the semiconductor laser element 23 is input to the optical modulator unit 24. The optical modulator unit 24 modulates the input light based on a signal which is generated by the modulation signal generator circuit 80 and which is input via the signal line 41 and the signal terminal 26, and outputs the light via the lens 30 and the tip portion 25a of the reception unit 25 of the optical transmitting package 20 to the optical fiber or the like (not shown) connected to the optical transmitting package 20.

In the present embodiment, the modulation signal generator circuit 80 generates a high-frequency signal. Because the capacitive component 61 and the resistive component 62 in the signal attenuation circuit 60 act as an impedance component of a few ohms in the high frequency band, the signal which is output from the optical modulator unit 24 and reaches the drive current supply line 42 via the common ground line 44 and the common ground 82 can be attenuated with the signal attenuation circuit 60.

With this structure, it is possible to suppress disturbance in the waveform of the light which is output from the semiconductor laser element 23.

In addition, because the signal attenuation circuit 60 is provided over the line board 40, even when the size of the signal attenuation circuit 60 is large, the signal attenuation circuit 60 can be provided in the optical transmitting module 10 without considering the volume of the reception unit 25 of the optical transmitting package 20.

With the signal attenuation circuit 60, a reduction in the influence of the electrical coupling between the drive current supply line 42 and the signal line 41 on the semiconductor laser element 23 having a narrow band resonance can be expected. In addition, reduction of the influence of the electrical reflection in the drive current supply line 42 on the semiconductor laser element 23 can be expected.

Figure 6:
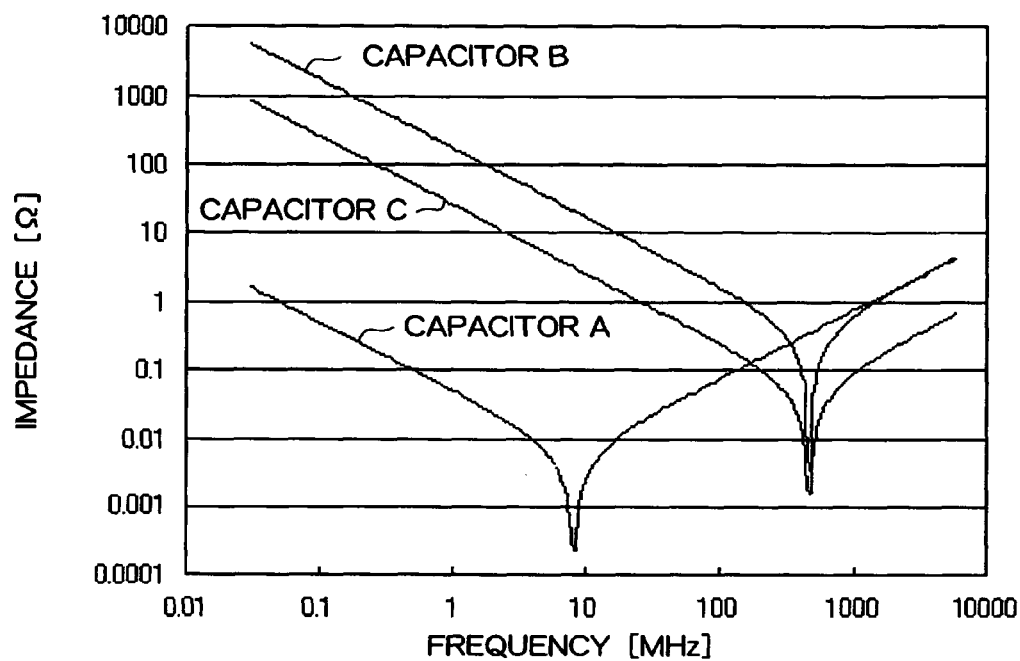
FIG. 6 is a diagram showing an example of an impedance-frequency characteristic for a capacitor A, a capacitor B, and a capacitor C.

FIG. 6 is a diagram showing an example of impedance-frequency characteristics for a capacitor A, a capacitor B, and a capacitor C. Here, the capacitor A has a capacitance of 100 pF and capacitors B and C have a capacitance of 220 pF.

Figure 7:
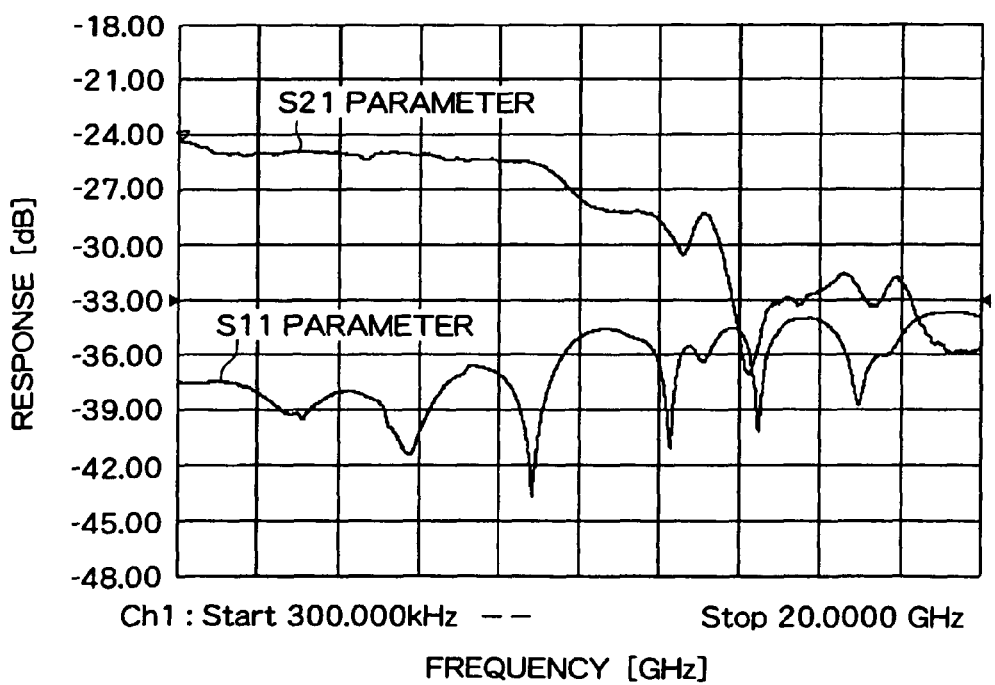
FIG. 7 is a diagram showing an example of a frequency response characteristic of an optical transmitting module when the capacitor A is used for the signal attenuation circuit.
Figure 8:
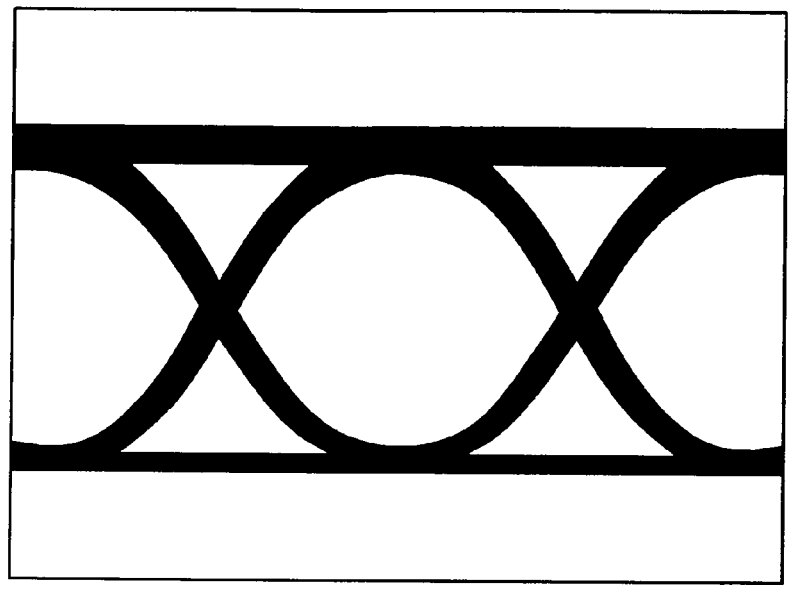
FIG. 8 is a diagram showing an example of an optical output waveform of an optical transmitting module when the capacitor A is used for the signal attenuation circuit.

FIG. 7 is a diagram showing an example of a frequency response characteristic of the optical transmitting module 10 when the capacitor A is used for the signal attenuation circuit 60. FIG. 8 is a diagram showing an example of an optical output waveform of the optical transmitting module 10 when the capacitor A is used for the signal attenuation circuit 60.

Figure 13:
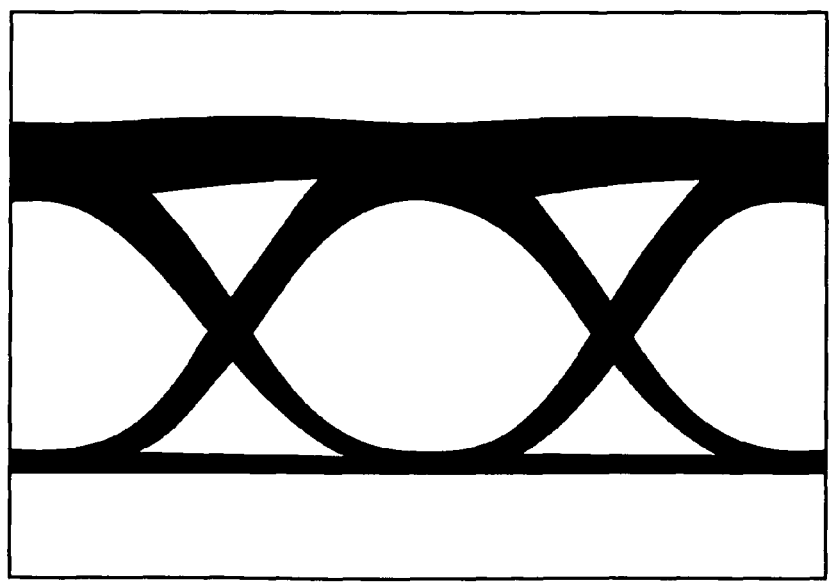
FIG. 13 is a diagram showing an example of an optical output waveform of an optical transmitting module shown in the equivalent circuit diagram of FIG. 11.

As shown in FIG. 7, no dip 90 is observed in the optical transmitting module 10 of the present embodiment. Because of this, as shown in FIG. 8, the eye-aperture of the optical output waveform is improved compared to the optical output waveform shown in FIG. 13.

Figure 9:
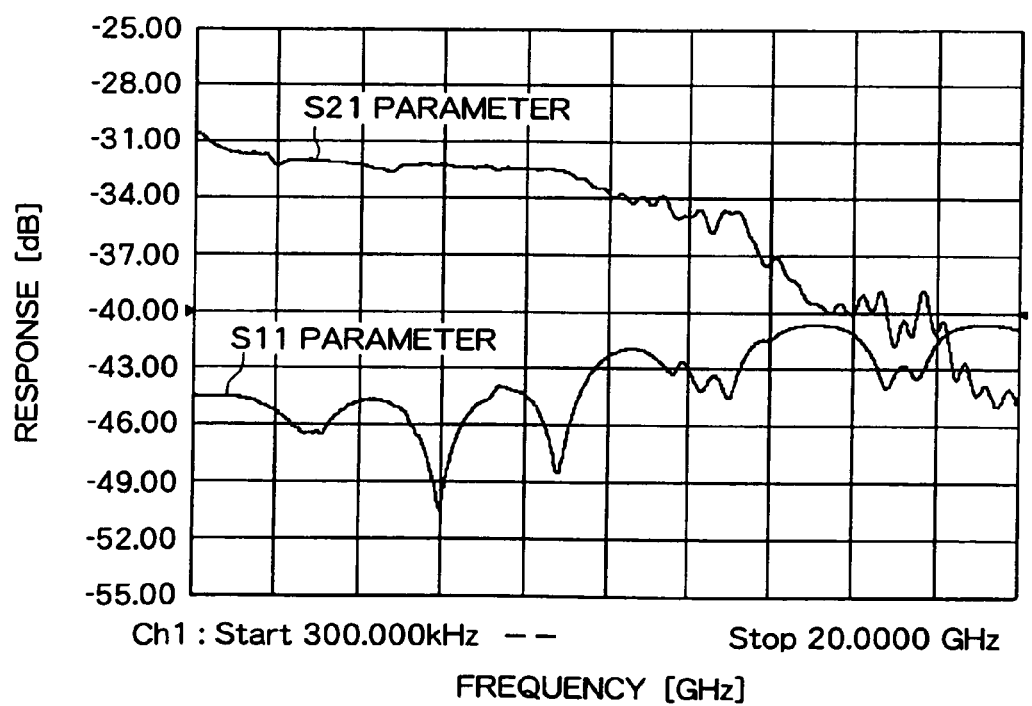
FIG. 9 is a diagram showing an example of a frequency response characteristic of an optical transmitting module when the capacitor B is used for the signal attenuation circuit.
Figure 10:
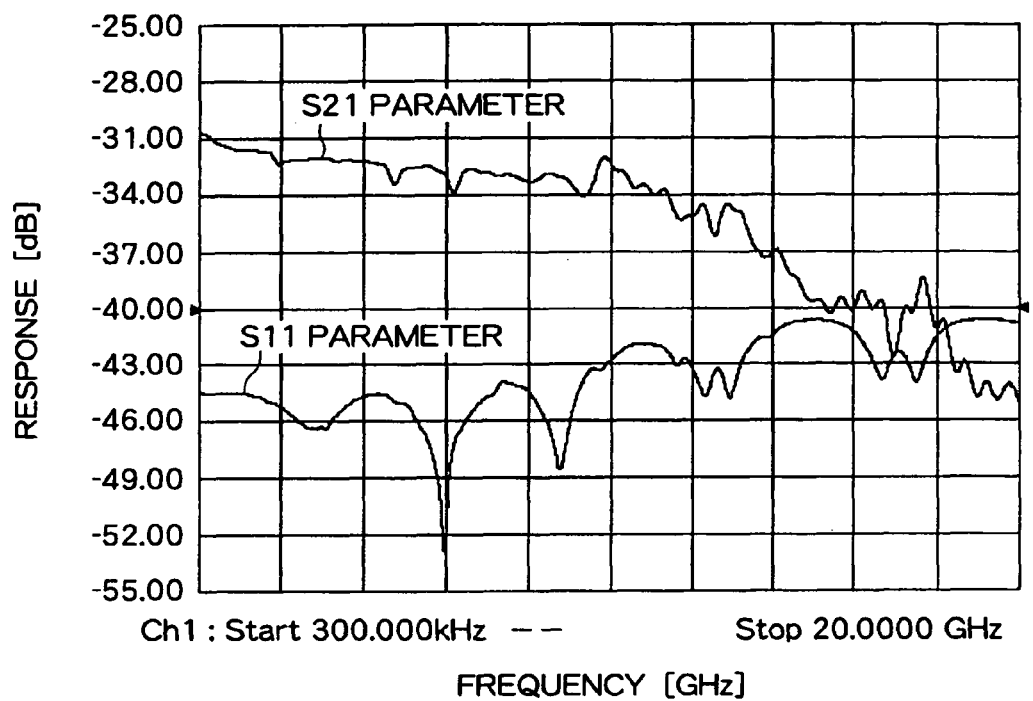
FIG. 10 is a diagram showing an example of a frequency response of an optical transmitting module when the capacitor C is used for the signal attenuation circuit.
Figure 11:
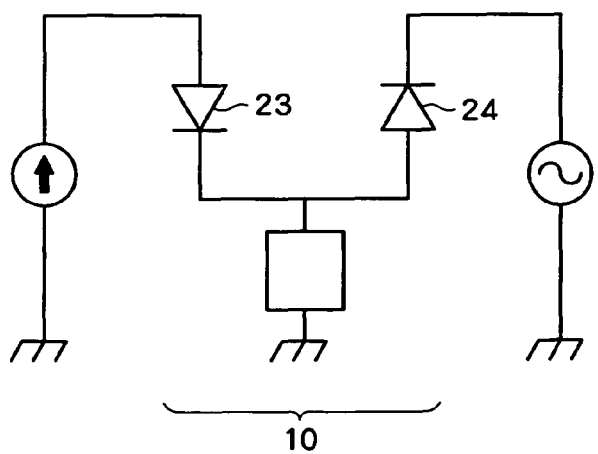
FIG. 11 is a diagram showing an example of an equivalent circuit of an optical transmitting module having an optical modulator such as an electro-absorptive modulator of related art.
Figure 12:
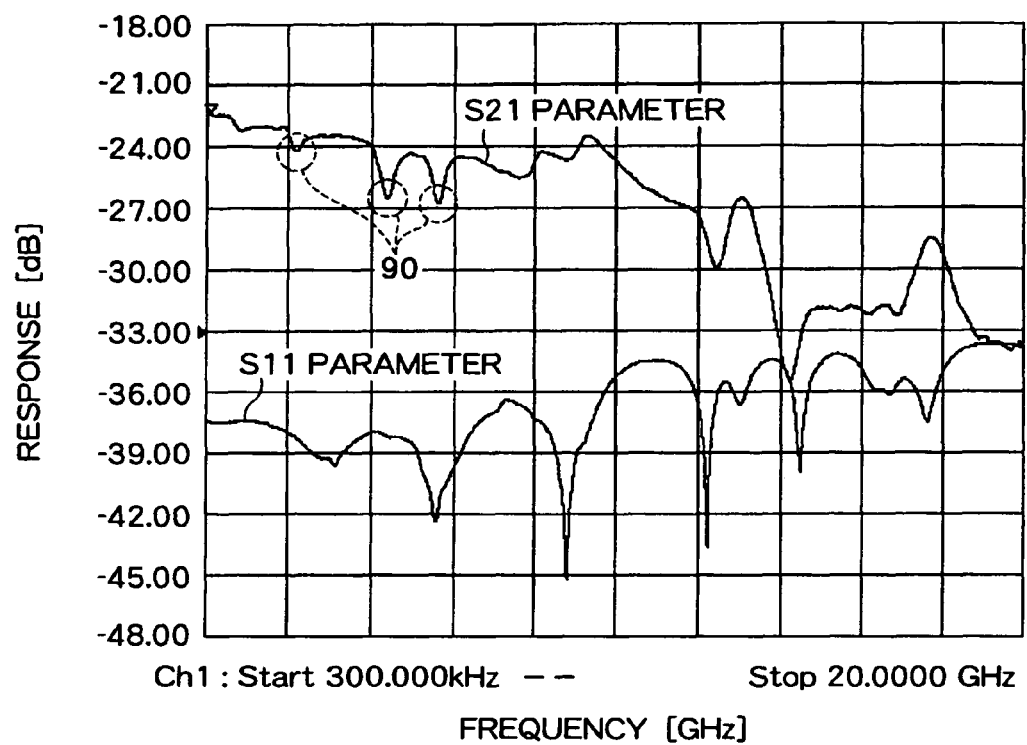
FIG. 12 is a diagram showing an example of a frequency response characteristic of an optical transmitting module shown in the equivalent circuit diagram of FIG. 11.

FIG. 9 is a diagram showing an example of a frequency response characteristic of the optical transmitting module 10 when the capacitor B is used for the signal attenuation circuit 60. FIG. 10 is a diagram showing an example of a frequency response characteristic of the optical transmitting module 10 when the capacitor C is used for the signal attenuation circuit 60. With the capacitors A and B, the impedance corresponding to 5 GHz is approximately 6 ohms, and with the capacitor C, the impedance corresponding to 5 GHz is approximately 0.5 ohms. From this, it can be understood that there is a difference in the attenuation characteristic depending on the value of the impedance at a desired frequency band.

The present invention is not limited to the above-described preferred embodiment.

For example, the signal line 41, the drive current supply line 42, and the common ground line 44 may be formed on an approximately same plane over the line board 40. More specifically, for example, the line board 40 may be formed so that the transmission path for transmitting the signal is a co-planar line.

In addition, it is sufficient that the optical modulator unit such as the optical modulator unit 24 is electrically connected to the signal line 41, and, the electrical connection between the optical modulator unit and the signal line 41 via the signal terminal 26 does not need to be realized.

Similarly, it is sufficient that the semiconductor laser element 23 is electrically connected to the drive current supply line 42, and the electrical connection between the semiconductor laser element 23 and the drive current supply line 42 via the drive current supply terminal 27 does not need to be realized.

Moreover, it is sufficient that the conductor board and the common ground 82 are electrically connected, and the electrical connection between the conductor board and the common ground 82 via the common ground terminal 28 does not need to be realized.

Furthermore, it is sufficient that the semiconductor laser element 23 and the optical modulator unit are electrically connected to the conductor board such as the conductor board 21, and the optical transmitting package 20 does not need to comprise the equipping board 22.

The above-described numerical values are merely exemplary, and the present invention is not limited to the above-described numerical values.

The above-described preferred embodiment is not limited to an optical transmitting module, and may be similarly applied to a device which executes a high-speed information communication through a flexible board such as, for example, an optical disk device and a portable phone.

While there have been described what are at present considered to be certain embodiments of the invention, it will be understood that various modifications may be made thereto, and it is intended that the appended claims cover all such modifications as fall within the true spirit and scope of the invention.

What is claimed is:

1. An optical transmitting module having an optical transmitting package of a coaxial type and a line board which is connected to the optical transmitting package, wherein
    the optical transmitting package comprises:
    a semiconductor laser element;
    an optical modulator unit which modulates, based on an input signal, light which is output from the semiconductor laser element; and
    a conductor board which is electrically connected to the semiconductor laser element and the optical modulator unit,
    a drive current supply line which supplies a drive current to the semiconductor laser element and a common ground line which electrically connects the conductor board and a common ground are formed over the line board, and
    a signal attenuation circuit which attenuates a signal which is output from the optical modulator unit and which has one end electrically connected to the common ground line and the other end electrically connected to the drive current supply line is provided over the line board.

2. The optical transmitting module according to claim 1, wherein
    a signal line which supplies a signal to be input to the optical modulator unit is formed over the line board.

3. The optical transmitting module according to claim 2, wherein
    at least a part of the drive current supply line and at least a part of the signal line are formed approximately parallel to each other.

4. The optical transmitting module according to claim 1, wherein
    the signal attenuation circuit is provided over the line board at a side of a surface opposite to a surface on which the line board is connected to the optical transmitting package.

5. The optical transmitting module according to claim 1, wherein
    an insulating film is formed between the drive current supply line and the common ground line,
    the line board further comprises a connection electrode for signal attenuation circuit which penetrates through the insulating film and which is electrically connected to the common ground line, and
    the signal attenuation circuit has one end electrically connected to the connection electrode for signal attenuation circuit and the other end electrically connected to the drive current supply line.

6. The optical transmitting module according to claim 1, wherein
    the one end of the signal attenuation circuit is electrically connected to the common ground line at a position on the common ground line where an electrical distance to an end which is electrically connected to the conductor board is shorter than an electrical distance to an end which is electrically connected to the common ground.

7. The optical transmitting module according to claim 1, wherein
    the signal attenuation circuit comprises a layered capacitor.

8. An optical transmitting device comprising:
    the optical transmitting module according to any one of claims 1-6;
    a drive power supply which supplies the drive current to the semiconductor laser element; and
    a modulation signal generator circuit which generates a signal to be input to the optical modulator unit.

\* \* \* \* \*